United States Patent
Matsunaga

[11] Patent Number: 6,166,604
[45] Date of Patent: Dec. 26, 2000

[54] SEMICONDUCTOR AMPLIFIER WITH COMPENSATED PASSING GAIN CHARACTERISTIC AND PASSING PHASE CHARACTERISTIC

[75] Inventor: Kohji Matsunaga, Tokyo, Japan

[73] Assignee: NEC Corporation, Tokyo, Japan

[21] Appl. No.: 09/332,983

[22] Filed: Jun. 15, 1999

[30] Foreign Application Priority Data

Jun. 18, 1998 [JP] Japan .................................. 10-171452

[51] Int. Cl.[7] .............................. H03F 1/26; H03F 1/30
[52] U.S. Cl. ........................................... 330/277; 330/302
[58] Field of Search .................................. 330/277, 302, 330/149; 375/296, 297

[56] References Cited

U.S. PATENT DOCUMENTS

| | | | |
|---|---|---|---|
| 5,194,826 | 3/1993 | Huusko | 330/302 |
| 5,202,649 | 4/1993 | Kashiwa | 330/277 |
| 5,343,172 | 8/1994 | Utsu et al. | 330/277 |
| 5,363,058 | 11/1994 | Sasaki | 330/277 |
| 5,506,544 | 4/1996 | Staudinger et al. | 330/277 |

FOREIGN PATENT DOCUMENTS

| | | |
|---|---|---|
| 56-40309 | 4/1981 | Japan . |
| 60-157305 | 8/1985 | Japan . |
| 1-295510 | 11/1989 | Japan . |
| 4175002 | 6/1992 | Japan ..................................... 330/277 |
| 6-350354 | 12/1994 | Japan . |
| 8-181544 | 7/1996 | Japan . |

*Primary Examiner*—Michael B Shingleton
*Attorney, Agent, or Firm*—Young & Thompson

[57] ABSTRACT

A semiconductor amplifier with a compensated passing gain characteristic and passing phase characteristic is disclosed. Connected to an input to a non-linear amplifying element is a characteristic improving circuit comprising a passive circuit including a capacitor, a resistor, and an inductor, and an FET connected to the passive circuit and having its source and a drain both grounded. In the characteristic improving circuit, with an increase in the input level, a gate capacitance of the FET is increased to enhance the passing gain and reduce the passing phase. Such characteristics of the characteristic improving circuit compensate for the characteristics of the FET to improve a phase characteristic and a distortion characteristic of the non-linear amplifying element at an output level.

12 Claims, 7 Drawing Sheets

SEMICONDUCTOR AMPLIFIER WITH COMPENSATED PASSING GAIN CHARACTERISTIC AND PASSING PHASE CHARACTERISTIC

BACKGROUND OF THE INVENTION

1. Field of the Invention

The present invention relates to a semiconductor amplifier for use in a microwave band or a millimeter wave band, and more particularly to a semiconductor amplifier including a distortion compensating circuit.

2. Description of the Related Art

Systems using a radio frequency such as a microwave, a millimeter wave or the like employ a semiconductor amplifier having a non-linear amplifying element such as a Field Effect Transistor (hereinafter referred to as FET) for performing power amplification for a radio frequency. A distortion characteristic of a semiconductor amplifier has a significant effect upon the performance of the entire system. In a prior art semiconductor amplifier, the distortion characteristic is improved by connecting a distortion compensating circuit such as a linearizer to a non-linear amplifying element to remove the distortion characteristic caused by non-linearity of the element.

FIG. 1 shows a configuration of such a prior art semiconductor amplifier. Description is made using an FET as an example of a non-linear amplifying element. The prior art semiconductor amplifier comprises linearizer 21, passive elements 22, 23, output matching circuit 4, and FET 1.

Signals received at input terminal 101 are applied to a gate electrode of FET 1 through passive element 23, linearizer 21, and passive element 22. FET 1 has its source electrode grounded and its drain electrode connected to output terminal 102 through output matching circuit 4.

Linearizer 21 has a characteristic that the gain thereof is increased and an amount of a phase shift is increased in a negative direction as applied power is increased. Linearizer 21 may be a combination of passive elements, such as a coupler and an active element, such as a diode, or the like.

Passive elements 22, 23 are isolators for example, and are intended for removing reflected components caused by mismatch between linearizer 21 and FET 1. Output matching circuit 4 serves to achieve matching between FET 1 and a load connected to output terminal 102.

In the prior art semiconductor amplifier, signals received at input terminal 101 are applied to the gate electrode of FET 1 through passive element 23, linearizer 21, and passive element 22, and are then amplified at FET 1 to be finally fed to output terminal 102 through output matching circuit 4.

In the prior art semiconductor amplifier, with an increase in applied power, FET 1 serving as a non-linear amplifying element exhibits reduced gain, a deteriorated phase characteristic (that is, a phase shift is increased in a positive direction), and increased distortion. However, the prior art semiconductor amplifier is provided with linearizer 21 having a passing phase characteristic and a passing gain characteristic opposite to those of FET 1, thereby canceling the characteristics of FET 1 with the characteristics of linearizer 21 and achieving a low distortion characteristic for the entire semiconductor amplifier.

When linearizer 21 is configured by an active element such as a diode in the prior art semiconductor amplifier, power is required for driving the active element.

Also, when linearizer 21 is connected to the semiconductor amplifier, the entire size of the semiconductor amplifier is increased. Additionally, mismatch is likely to occur between linearizer 21 and FET 1 serving as a non-linear amplifying element, which requires passive elements 22, 23 such as an isolator for removing reflected components due to the mismatch, resulting in an increased size of the semiconductor amplifier.

SUMMARY OF THE INVENTION

It is an object of the present invention to provide a semiconductor amplifier having a distortion compensating circuit with reduced power consumption.

It is another object of the present invention to provide a semiconductor amplifier with a reduced size.

According to one aspect of the invention, the semiconductor amplifier has a characteristic improving circuit with a passing gain characteristic and a passing phase characteristic opposite to a passing gain characteristic and a passing phase characteristic of a non-linear amplifying element. The characteristic improving circuit is provided on an input or output side of the non-linear amplifying element and comprises a passive element and an FET having its source electrode and its drain electrode both grounded.

In an embodiment of the present invention, the passive element in the characteristic improving circuit includes a capacitor having its one end connected to an input signal line to the non-linear amplifying element, a resistor having its one end connected to the other end of the capacitor, and an inductor having its one end connected to the other end of the resistor and its other end connected to a gate electrode of the FET.

According to another aspect of the invention, the semiconductor amplifier further comprises an input matching circuit or an output matching circuit for matching impedance characteristics of the non-linear amplifying element and the characteristic improving circuit.

Since in the semiconductor amplifier according to the present invention, the characteristic improving circuit has a passing gain characteristic and a passing phase characteristic opposite to a passing gain characteristic and a passing phase characteristic of the non-linear amplifying element, the linearity of the passing gain and the passing phase of the entire semiconductor amplifier is maintained even when an input level is increased to vary the passing gain characteristic and the passing phase characteristic of the non-linear amplifying element. Therefore, a distortion characteristic can be improved similarly to the prior art semiconductor amplifier.

Since the characteristic improving circuit comprises the passive element and the FET having its source electrode and its drain electrode both grounded, the present invention can reduce a size of the entire semiconductor amplifier as compared with a case in which a prior art linearizer or the like is used.

In the present invention, the capacitor of the characteristic improving circuit is provided at the closest position to the signal line, thus preventing a direct current caused by a received signal voltage at an input terminal from flowing through a passive circuit to reduce power consumption.

According to a still another aspect of the invention, the characteristic improving circuit comprises a passive element and a diode having a grounded cathode. Also, the use of a diode instead of an FET to constitute the characteristic improving circuit, makes it possible to reduce the size of the entire semiconductor amplifier and power consumption similarly to a case in which an FET is used.

The above and other objects, features and advantages of the present invention will become apparent from the following description with reference to the accompanying drawings which illustrate examples of the present invention.

DETAILED DESCRIPTION OF THE PREFERRED EMBODIMENTS

First Embodiment

Figure 2:
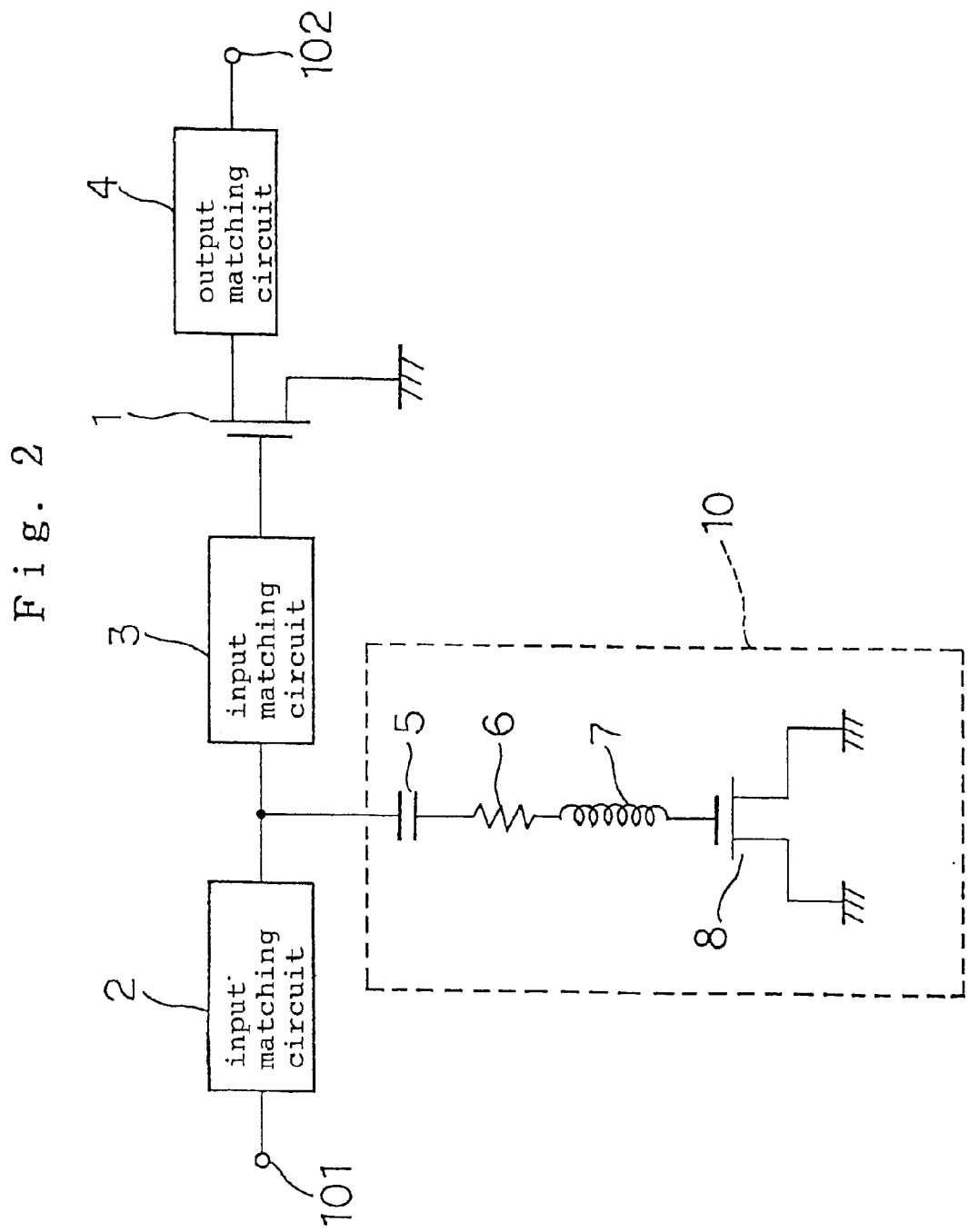
FIG. 2 is a circuit diagram showing a configuration of a semiconductor amplifier in a first embodiment of the present invention.

Referring to FIG. 2, there is shown a semiconductor amplifier according to a first embodiment of the present invention. The semiconductor amplifier comprises input matching circuits 2, 3, a characteristic improving circuit 10, FET 1, and an output matching circuit 4. The embodiment employs an FET as an example of a non-linear element.

In the semiconductor amplifier of the embodiment, a signal received at input terminal 101 is applied to a gate electrode of FET 1 through input matching circuit 2 and input matching circuit 3, and is amplified at FET 1. The signal amplified at FET is supplied from a drain electrode of FET 1 to output terminal 102 through output matching circuit 4. A source electrode of FET 1 is grounded similarly to the prior art semiconductor amplifier in FIG. 1.

Characteristic improving circuit 10 is connected between input matching circuit 2 and input matching circuit 3. Characteristic improving circuit 10 comprises a capacitor 5, a resistor 6, an inductor 7, and an FET 8.

Capacitor 5 has its one end connected between input matching circuit 2 and input matching circuit 3. Resistor 6 has its one end connected to the other end of capacitor 5. Inductor 7 has its one end connected to the other end of resistor 6. Capacitor 5, resistor 6, and inductor 7 constitute a passive circuit.

FET 8 has a gate width smaller than that of FET 1, and has its source electrode and drain electrode both grounded and its gate electrode connected to the other end of inductor 7.

Figure 3:
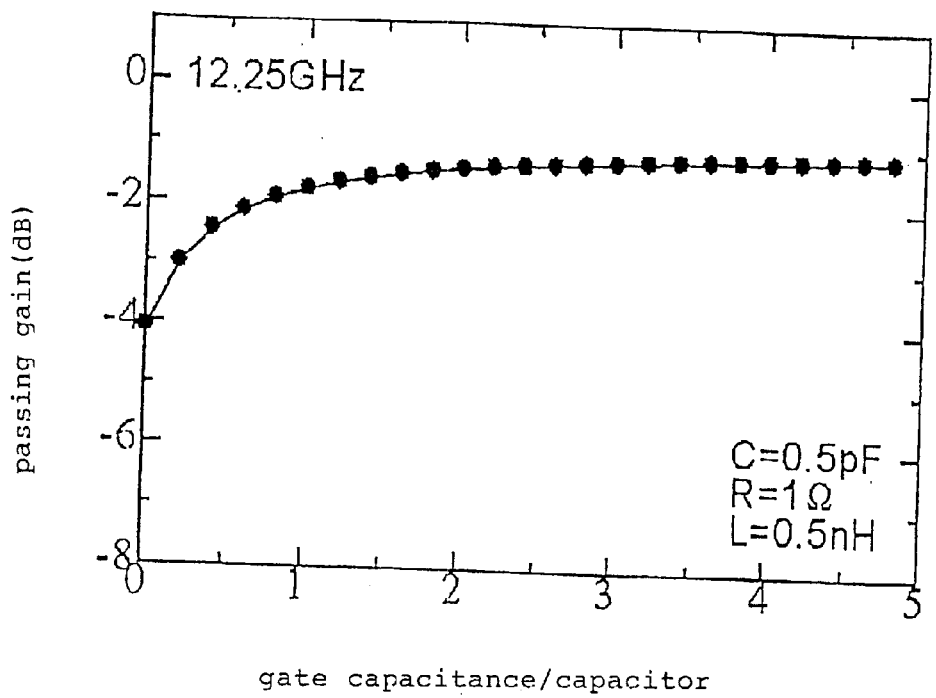
FIG. 3 is a graph illustrating an example of calculated passing gain of characteristic improving circuit 10 of the semiconductor amplifier in FIG. 2.
Figure 4:
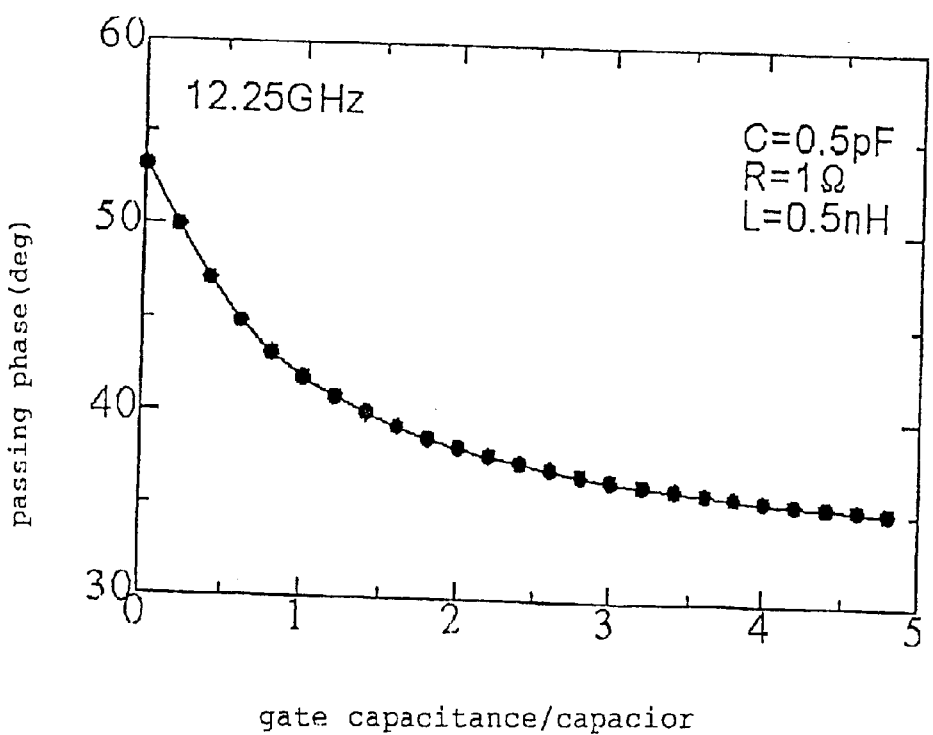
FIG. 4 is a graph illustrating an example of a calculated passing phase characteristic of characteristic improving circuit 10 of the semiconductor amplifier in FIG. 2.

Next, operation of the semiconductor amplifier of the embodiment will be described. First, an example of calculated passing gain of characteristic improving circuit 10 is shown in FIG. 3, while an example of a calculated passing phase characteristic of characteristic improving circuit 10 is shown in FIG. 4. FIG. 3 and FIG. 4 are graphs illustrating changes in the passing gain and the passing phase of characteristic improving circuit 10 with respect to a ratio between capacitor 5 and a gate capacitance of FET 8, respectively. Let it be assumed that a signal to be amplified has a frequency of 12.25 GHz, capacitor 5 is at 0.5 pF, resistor 6 at 1 Ω, inductor 7 at 0.5 nH.

Referring to FIG. 3 and FIG. 4, it can be seen that the passing gain is increased and the passing phase is reduced as the ratio between the gate capacitance of FET 8 and the capacitance of capacitor 5 is changed from 1 to 5. Additionally, as the level of a signal applied to input terminal 101 is increased, the gate capacitance of FET 8 is increased but the capacitance of capacitor 5 is constant, thereby increasing the passing gain of characteristic improving circuit 10 and reducing the passing phase thereof. For FET 1, with an increase in the level of a signal applied to input terminal 101, the passing gain of FET 1 is reduced and the passing phase thereof is increased.

Figure 1:
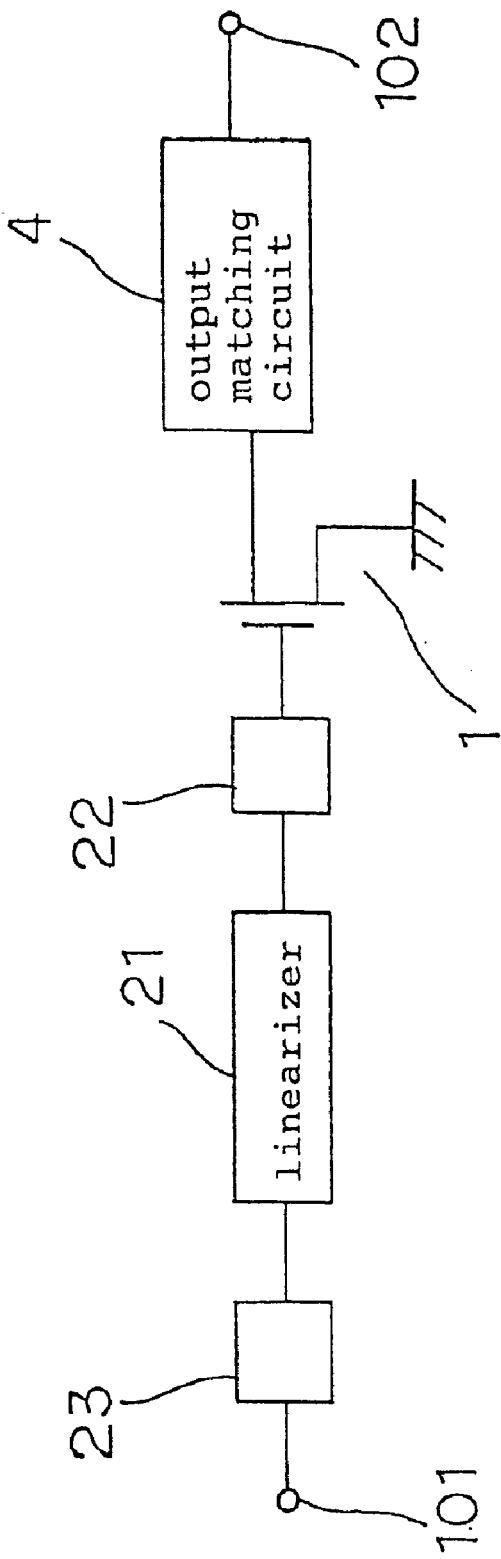
FIG. 1 is a circuit diagram showing a prior art semiconductor amplifier.

As apparent from the aforementioned description, characteristic improving circuit 10 according to the present invention operates to compensate for the passing gain and passing phase characteristics of FET 1, similarly to linearizer 21 in the prior art semiconductor amplifier shown in FIG. 1. As a result, the provision of characteristic improving circuit 10 improves the distortion characteristic of the semiconductor amplifier of the embodiment.

Additionally, since characteristic improving circuit 10 constitutes an input circuit for the entire semiconductor amplifier together with input matching circuits 2, 3, a reduction in size of the entire semiconductor amplifier can be achieved. Capacitor 5 is provided at the closest position to a signal line, so that a direct current caused by a received signal voltage at input terminal 101 is prevented from flowing through the passive circuit, and power consumption is reduced. Since FET 8 has its source electrode and its drain electrode both grounded, it neither operates nor consumes any power.

Figure 5:
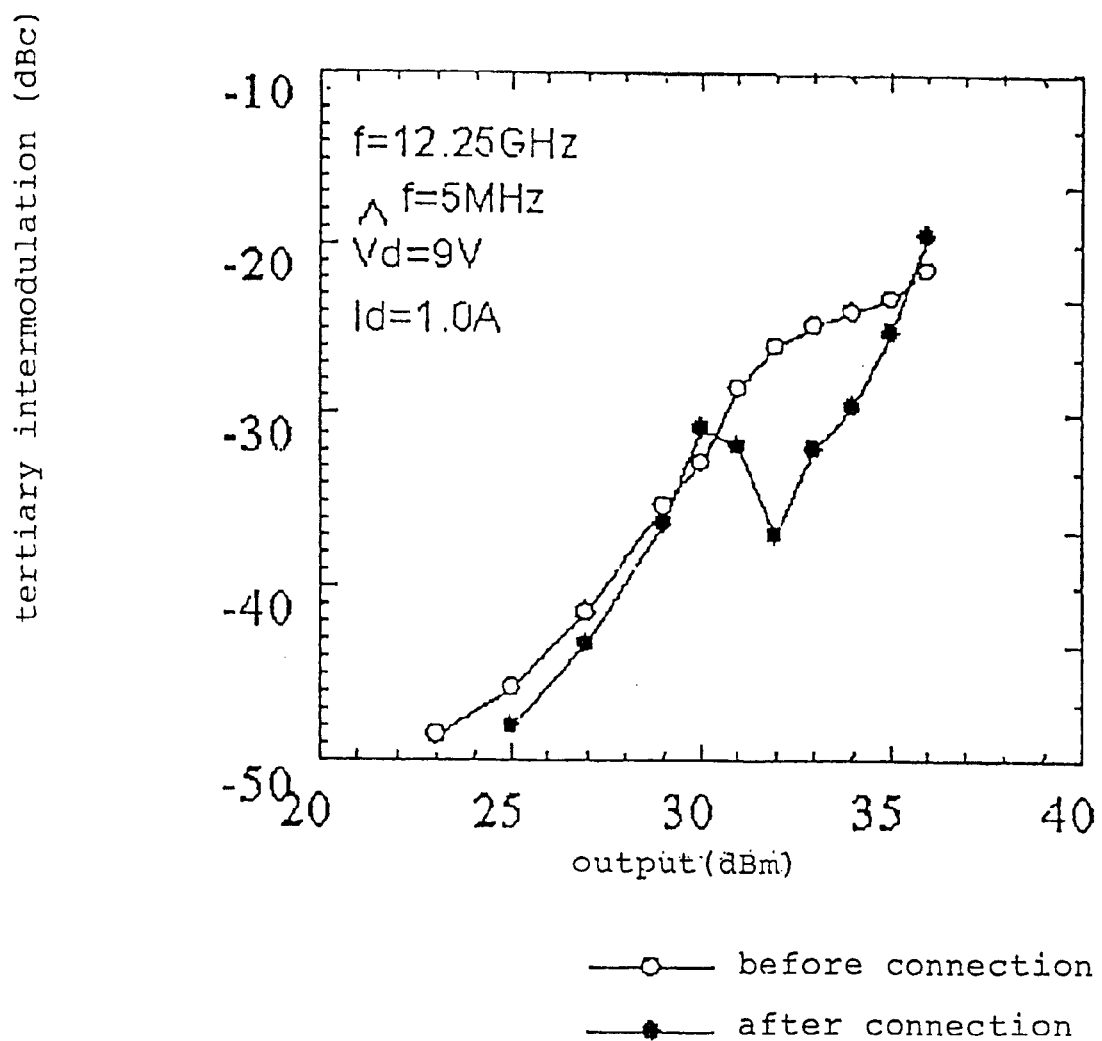
FIG. 5 is a graph showing dependency of a distortion characteristic (tertiary intermodulation) on outputs of the semiconductor amplifier in FIG. 2 before and after the connection of characteristic improving circuit 10.

FIG. 5 shows a graph showing input/output characteristics and a distortion characteristic (tertiary intermodulation) of the semiconductor amplifier of the embodiment before and after the connection of characteristic improving circuit 10. With reference to FIG. 5, it can be seen that the provision of characteristic improving circuit 10 achieves lower distortion for the same output level, except at some output levels.

In this embodiment, values of capacitor 5, resistor 6, and inductor 7 are set such that lower distortion can be achieved when the frequency of a signal to be amplified is at 12.25 GHz. However, lower distortion at a specific output level can be achieved at an arbitrary frequency by setting other values for them.

Figure 6:
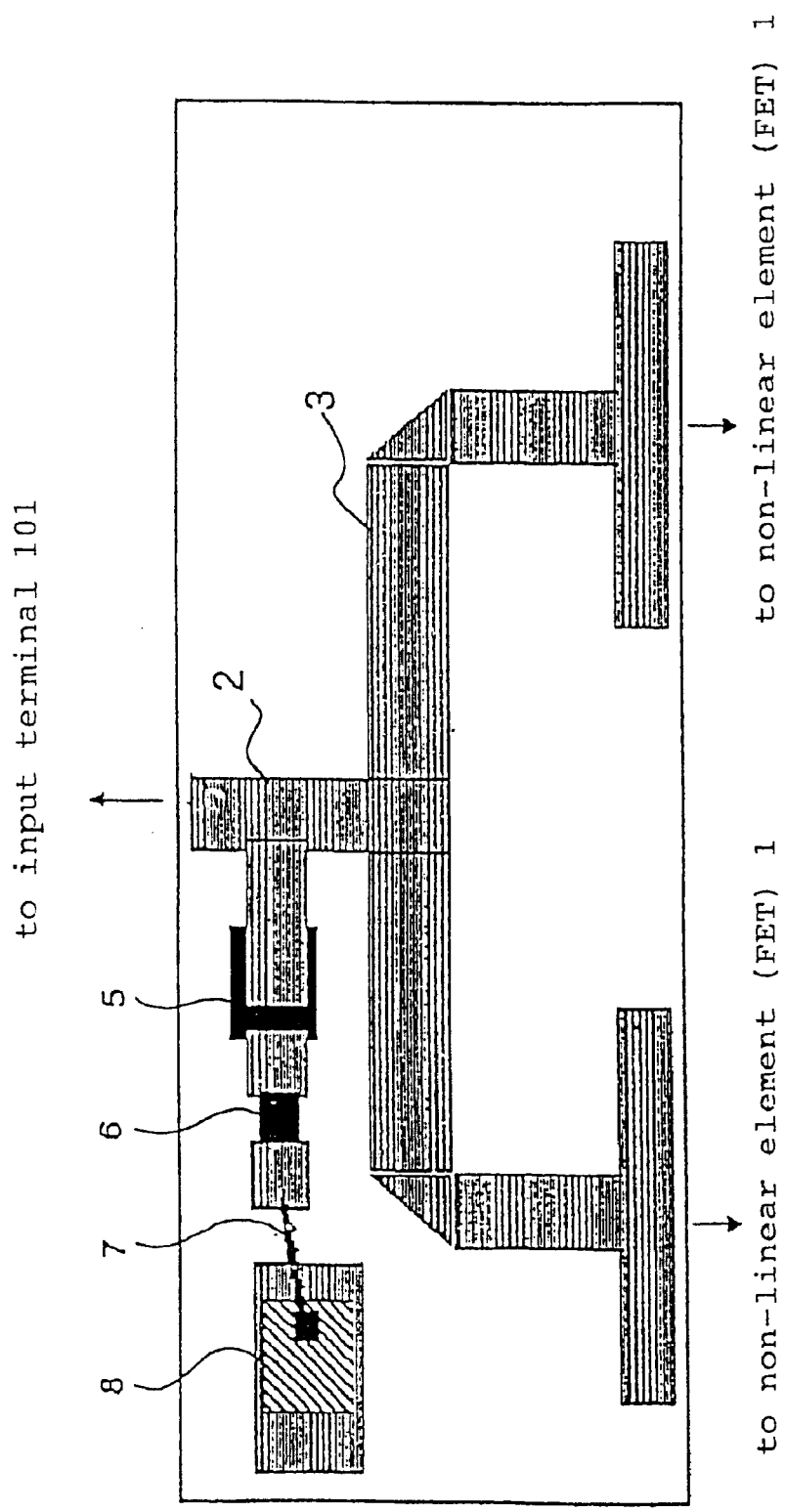
FIG. 6 is a diagram showing a specific example of a configuration of the semiconductor amplifier in FIG. 2.

Next, an example of a specific configuration of the semiconductor amplifier in the embodiment will be described with reference to FIG. 6. FIG. 6 is a diagram showing an example in which an input circuit comprising input matching circuits 2, 3 and characteristic improving circuit 10 is formed as an actual semiconductor device.

Input matching circuits 2, 3 and characteristic improving circuit 10 are implemented on a dielectric substrate made of as alumina, aluminum nitride, or the like. In FIG. 6, input matching circuits 2, 3 are formed of distributed constant lines and resistor 6 are formed of a thin film or the like. Inductor 7 are formed of gold wires.

FET 8 has its source electrode and its drain electrode both grounded through the back side of the dielectric substrate with a via hole formed therein. The capacitance of capacitor 5 is determined by the area of a lower electrode and the permittivity of a dielectric film. The resistance value of resistor 6 is determined by the line length of the thin film. The value of inductor 7 is determined by the length of the gold wire. The input circuit for the semiconductor amplifier shown in FIG. 6 can be formed on a dielectric substrate with a small area of 4.7 mm×1.8 mm.

Figure 8:
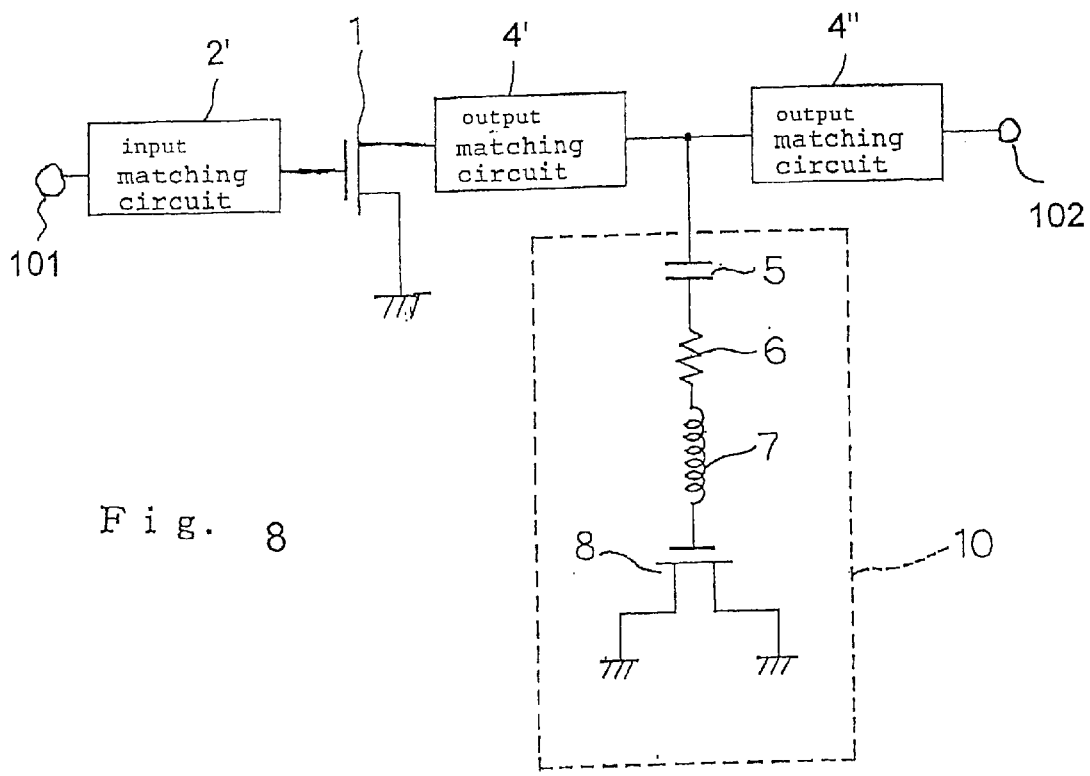
FIGS. 8 and 9 are circuit diagrams of further embodiments of the present invention.
Figure 9:
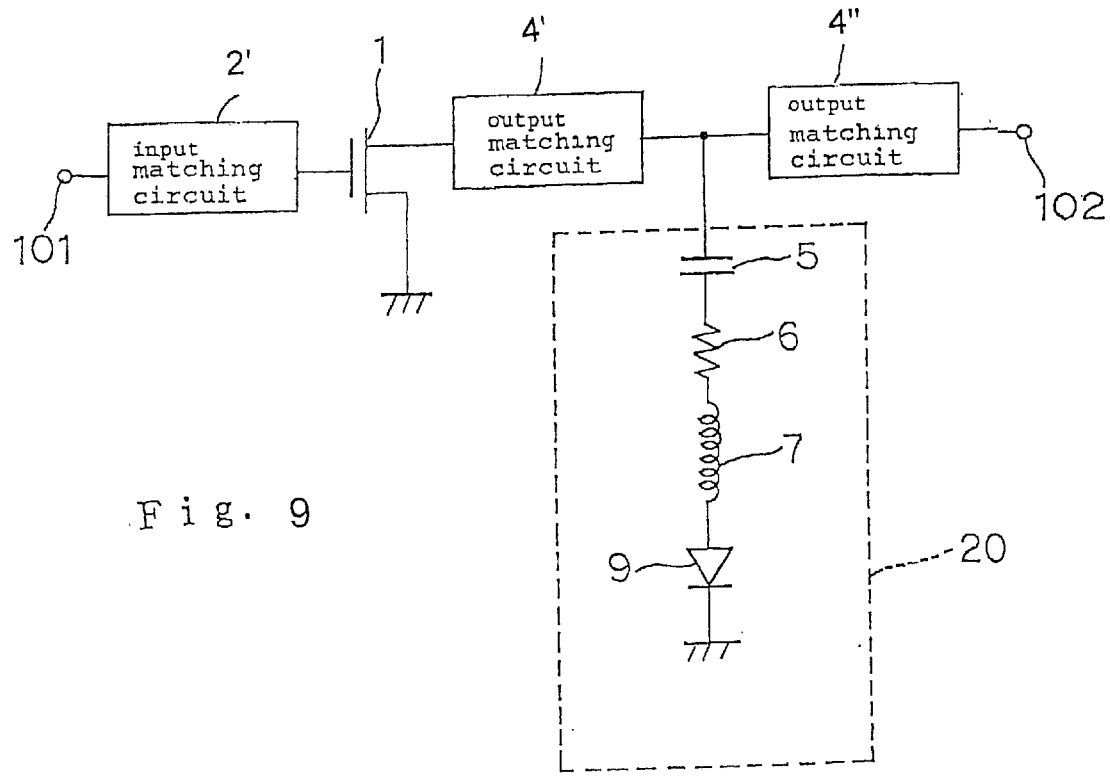

While the input circuit is implemented on a substrate made of alumina, aluminum nitride or the like separately from FET 1 in FIG. 6, the input circuit may be implemented on the same substrate as FET 1 as in an MMIC (Microwave Monolithic IC). Additionally, while characteristic improving circuit 10 is provided between input matching circuits 2, 3, it may be formed between two output matching circuits 4' provided between the drain electrode of FET 1 and output terminal 102 such as shown in FIGS. 8 and 9. Moreover, if the aforementioned input circuit is formed on the same substrate (gallium arsenide: GaAs, indium phosphide: InP, or the like) as a non-linear amplifying element for amplification, similar effects can be achieved.

Second Embodiment

Next, a semiconductor amplifier of a second embodiment according to the present invention will be described below.

Figure 7:
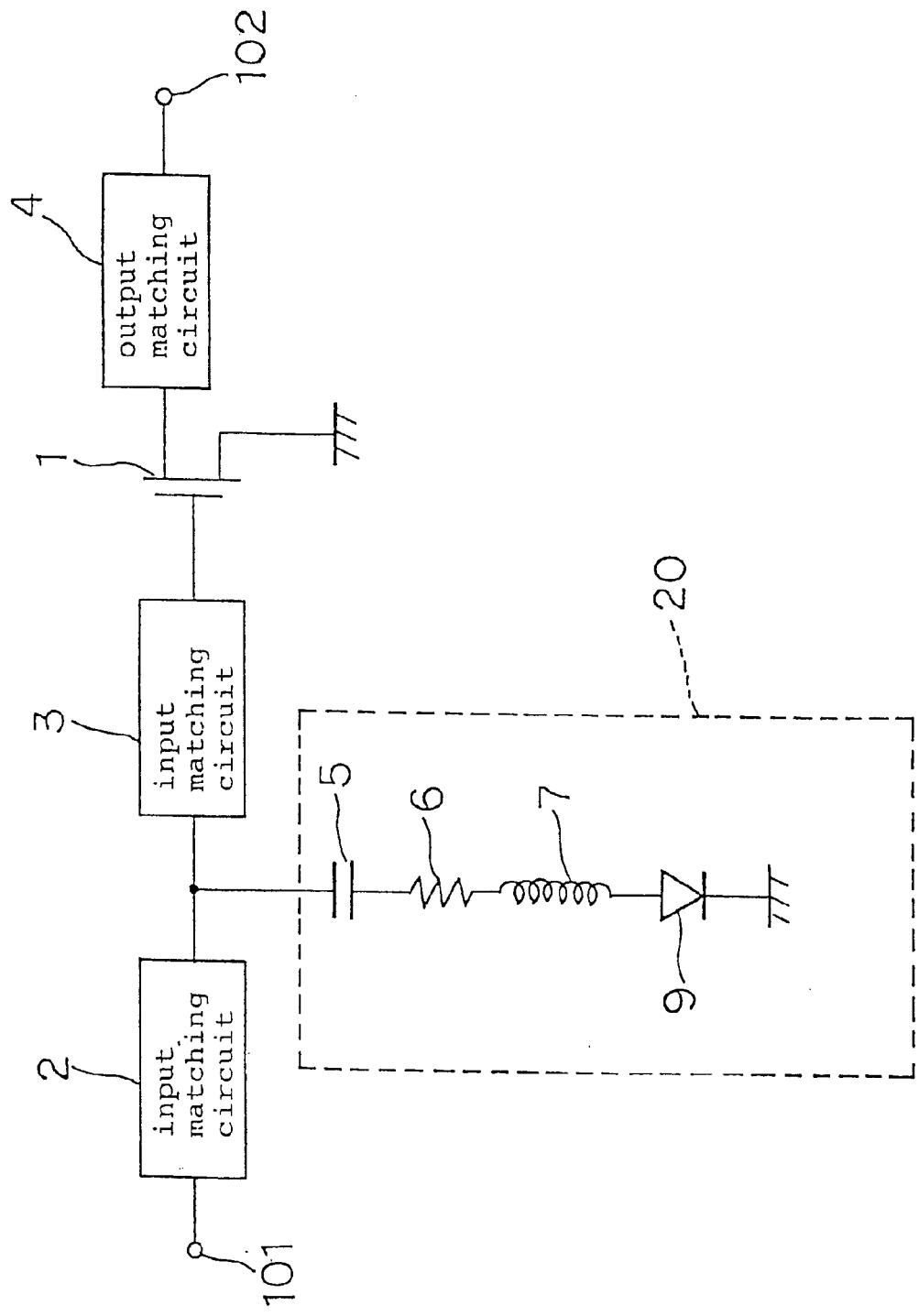
FIG. 7 is a circuit diagram of a semiconductor amplifier in a second embodiment of the present invention.

As shown in FIG. 7, the semiconductor amplifier of the present embodiment has characteristic improving circuit 20 instead of characteristic improving circuit 10 in the semiconductor amplifier of the first embodiment shown in FIG. 2.

Characteristic improving circuit 20 is a modification of characteristic improving circuit 10 in which a diode 9 has been substituted for FET 8. Diode 9 is grounded in a forward direction with an anode electrode connected to inductor 7 and a grounded cathode electrode.

With the increase in the level of a signal applied to input terminal 101, the capacitance of diode 9 is increased, which in turn enhances the passing gain of characteristic improving circuit 20 and reduces the passing phase thereof. In other words, characteristic improving circuit 20 has a similar characteristic to that of characteristic improving circuit 10 of the first embodiment.

As a result, similar effects to those of the first embodiment can be obtained when diode 9 is used instead of FET 8 in a passive circuit comprising capacitor 5, resistor 6, and inductor 7 as in the semiconductor amplifier of the embodiment.

While the aforementioned first and second embodiments have been described in conjunction with an FET used as a non-linear amplifying element, the present invention is not limited to this and is applicable similarly to a semiconductor amplifier which uses another type of non-linear amplifiers.

While preferred embodiments of the present invention have been described using specific terms, such description is for illustrative purposes only, and it is to be understood that changes and variations may be made without departing from the spirit or scope of the following claims.

What is claimed is:

1. A semiconductor amplifier comprising:
a non-linear amplifying element for amplifying an input signal to output the amplified signal; and
a characteristic improving circuit provided on an input side of said non-linear amplifying element and including a passive element and an FET having its source electrode and its drain electrode both grounded to have a passing gain characteristic and passing phase characteristic opposite to a passing gain characteristic and passing phase characteristic of said non-linear amplifying element,
wherein the passive element in said characteristic improving circuit includes,
a capacitor having its one end connected to an input signal line to said non-linear amplifying element,
a resistor having its one end connected to the other end of the capacitor, and
an inductor having its one end connected to the other end of the resistor and the other end connected to a gate electrode of the FET.

2. The semiconductor amplifier according to claim 1, wherein said non-linear amplifying element is an FET for amplification having a grounded source electrode.

3. The semiconductor amplifier according to claim 1, further comprising an input matching circuit for matching impedance characteristics of said non-linear amplifying element and said characteristic improving circuit.

4. A semiconductor amplifier comprising:
a non-linear amplifying element for amplifying an input signal to output the amplified signal; and
a characteristic improving circuit provided on an output side of said non-linear amplifying element and including a passive element and an FET having its source electrode and a drain electrode both grounded to have a passing gain characteristic and passing phase characteristic opposite to a passing gain characteristic and passing phase characteristic of said non-linear amplifying element,
wherein the passive element in said characteristic improving circuit includes,
a capacitor having its one end connected to an output signal line from said non-linear amplifying element,
a resistor having its one end connected to the other end of the capacitor, and
an inductor having its one end connected to the other end of the resistor and the other end connected to a gate electrode of the FET.

5. The semiconductor amplifier according to claim 4, wherein said non-linear amplifying element is an FET for amplification having a grounded source electrode.

6. The semiconductor amplifier according to claim 4, further comprising an output matching circuit for matching impedance characteristics of said non-linear amplifying element and said characteristic improving circuit.

7. A semiconductor amplifier comprising:
a non-linear amplifying element for amplifying an input signal to output the amplified signal; and
a characteristic improving circuit provided on an input side of said non-linear amplifying element and including a passive element and a diode having a grounded cathode electrode to have a passing gain characteristic and passing phase characteristic opposite to a passing gain characteristic and passing phase characteristic of said non-linear amplifying element,
wherein the passive element in said characteristic improving circuit includes,
a capacitor having its one end connected to an input signal line to said non-linear amplifying element,
a resistor having its one end connected to the other end of the capacitor, and
an inductor having its one end connected to the other end of the resistor and the other end connected to an anode electrode of the diode.

8. The semiconductor amplifier according to claim 7, wherein said non-linear amplifying element is an FET for amplification having a grounded source electrode.

9. The semiconductor amplifier according to claim 7, further comprising an input matching circuit for matching impedance characteristics of said non-linear amplifying element and said characteristic improving circuit.

10. A semiconductor amplifier comprising:
   a non-linear amplifying element for amplifying an input signal to output the amplified signal; and
   a characteristic improving circuit provided on an output side of said non-linear amplifying element and including a passive element and a diode having a grounded cathode electrode to have a passing gain characteristic and passing phase characteristic opposite to a passing gain characteristic and passing phase characteristic of said non-linear amplifying element,
   wherein the passive element in said characteristic improving circuit includes,
      a capacitor having its one end connected to an output signal line from said non-linear amplifying element,
      a resistor having its one end connected to the other end of the capacitor, and
      an inductor having its one end connected to the other end of the resistor and the other end connected to an anode electrode of the diode.

11. The semiconductor amplifier according to claim 10, wherein said non-linear amplifying element is an FET for amplification having a grounded source electrode.

12. The semiconductor amplifier according to claim 10, further comprising an output matching circuit for matching impedance characteristics of said non-linear amplifying element and said characteristic improving circuit.

* * * * *